United States Patent
Clabes et al.

(10) Patent No.: US 7,657,772 B2
(45) Date of Patent: Feb. 2, 2010

(54) THERMALLY AWARE INTEGRATED CIRCUIT

(75) Inventors: Joachim Gerhard Clabes, Austin, TX (US); Michael Stephen Floyd, Austin, TX (US); Paul David Muench, Poughkeepsie, NY (US); Lawrence Joseph Powell, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 1693 days.

(21) Appl. No.: 10/366,437

(22) Filed: Feb. 13, 2003

(65) Prior Publication Data

US 2004/0159904 A1 Aug. 19, 2004

(51) Int. Cl.
G06F 1/04 (2006.01)
G06F 1/14 (2006.01)

(52) U.S. Cl. .................. 713/500; 713/501; 713/502; 327/83; 327/138; 327/512

(58) Field of Classification Search .............. 713/500, 713/501, 502; 327/83, 138, 512
See application file for complete search history.

(56) References Cited

U.S. PATENT DOCUMENTS

| | | | | |
|---|---|---|---|---|
| 5,039,878 A | * | 8/1991 | Armstrong et al. | 327/512 |
| 5,502,838 A | * | 3/1996 | Kikinis | 713/501 |
| 5,832,284 A | * | 11/1998 | Michail et al. | 713/322 |
| 2004/0037346 A1 | * | 2/2004 | Rusu et al. | 374/121 |

* cited by examiner

*Primary Examiner*—Thomas Lee
*Assistant Examiner*—Michael J Brown
(74) *Attorney, Agent, or Firm*—Casimer K. Salys; Anthony V. S. England; Joseph P. Lally

(57) ABSTRACT

An integrated circuit having a temperature sensitive circuit (TSC) to generate a signal indicative of the substrate temperature near the TSC. The integrated circuit has circuitry configured to receive a TSC signal from at least one TSC and to convert the TSC signal to a signal indicative of the integrated circuit's temperature. The thermal control circuit compares the integrated circuit temperature to a threshold and produces a corrective action signal when the temperature exceeds the threshold. The corrective action signal is provided to corrective action circuitry preferably configured to modify the operation of the IC to reduce the IC temperature in proximity to the corresponding TSC.

11 Claims, 5 Drawing Sheets

THERMALLY AWARE INTEGRATED CIRCUIT

BACKGROUND

1. Field of the Present Invention

The present invention generally relates to the field of electronic devices and more particularly to the field of controlling heat dissipation in an integrated circuit.

2. History of Related Art

As microprocessor designs grow increasingly more complex, they demand a larger functional area and typically consume more power. The area required to perform the necessary requirements of modern microprocessors has caused the industry to concentrate on moving devices increasingly closer together to limit physical chip sizes and increase clock speed. Because of this trend, power density has become a major consideration in the design of microprocessors. In dense chips, the proximity of heat producing functional blocks coupled with high clock speeds can cause the generation of more heat than the device is physically capable of dissipating. Unfortunately, it is not always possible to address this problem by simply consuming more space or eliminating selected functional blocks. Therefore, it would be desirable to implement an integrated circuit such as a microprocessor capable of actively monitoring the heat it produces and to take corrective action when the heat exceeds a threshold.

SUMMARY OF THE INVENTION

The problems identified above are addressed by an integrated circuit that includes a temperature sensitive circuit (TSC) to generate a signal indicative of the temperature near the TSC. The integrated circuit further includes thermal control circuitry configured to receive a TSC signal from at least one TSC and to convert the TSC signal to a digital signal indicative of the integrated circuit's temperature. The thermal control circuit compares the integrated circuit temperature to a programmable threshold and produces a corrective action signal when the IC temperature exceeds the threshold. The corrective action signal is provided to corrective action circuitry preferably configured to modify the operation of the IC to reduce the IC temperature in proximity to the corresponding TSC.

In one embodiment, the TSC is implemented as a series of CMOS inverter gates, with the series output driving the series input to form an integrated circuit oscillator. Because the gates of the oscillator are formed within the IC substrate and because it is well known that the gate delay varies predictably with temperature, the oscillator's frequency will vary in a reliable manner with the temperature such that the oscillator frequency will increase at lower temperatures and decrease at higher temperatures. The TSC's temperature sensitivity may be enhanced by incorporating additional design elements into the TSC design. As an example, the TSC may be connected between Vdd and a "local ground" controlled by a circuit that produces a temperature dependent voltage. The local ground could, for example, be generated by drawing a relatively constant current through a pair of n-channel transistors connected in a source-follower configuration. In such a design, the local ground voltage rises with temperature thereby contracting the TSC rail-to-rail voltage and causing an additional decrease in the speed (frequency) of the TSC.

Once the substrate temperature is determined, it is compared to a threshold value to see if the substrate temperature is within an acceptable range. If the IC substrate temperature exceeds the threshold, a corrective action signal is asserted and provided to a corrective action algorithm implemented in hardware or software to take action that will reduce the substrate temperature in proximity to the TSC. Corrective action may include reducing the frequency, supply voltage, or both to selected circuits and/or turning off selected circuits entirely.

In one embodiment, the thermal control circuitry includes a set of temperature cells that receive the signals produced by the TSC. A temperature cell is typically provided within each major functional block of the integrated circuit. Each such cell is preferably capable of receiving multiple signals up to a threshold number of signals. In one embodiment, each cell for receiving the TSC signals produces a time-sliced, serial signal where the serial signal indicates the substrate temperature in proximity to the corresponding TSC. A centralized control unit receives serial signals from each of the temperature cells. In this embodiment, the centralized control cell is responsible for extracting the temperature data from the serialized signal, for comparing the extracted temperatures to appropriate threshold value(s), and to initiate corrective action when the extracted temperature exceeds a threshold. The corrective action taken in response to an over temperature condition is implementation specific and is not the subject or focus of the present application.

BRIEF DESCRIPTION OF THE DRAWINGS

Other objects and advantages of the invention will become apparent upon reading the following detailed description and upon reference to the accompanying drawings in which.

Figure 1:
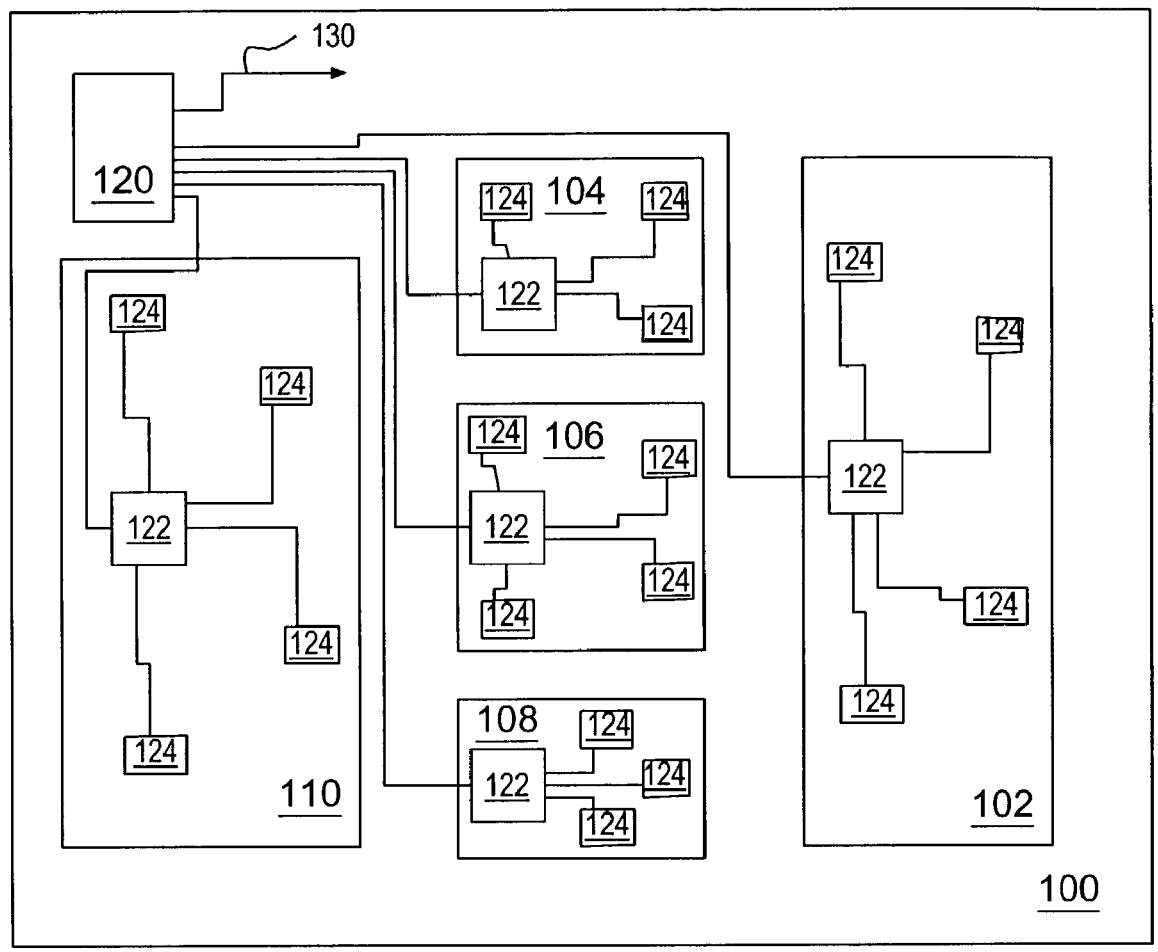
FIG. 1 is a block diagram of selected elements of an integrated circuit according to one embodiment of the invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention encompasses the design of a temperature aware integrated circuit (IC) that is able to alter its operation to reduce the heat it is generating upon determining that at least some portion of the IC is too hot. The IC includes a set of small, reliable temperature sensors or temperature sensitive circuits (TSC). Each TSC is formed within the IC and produces a signal having one or more characteristics that vary with temperature. A temperature cell receives the signal(s) produced by one or more TSC and determines the temperature of the IC substrate in proximity to each TSC based on the corresponding signals. A centralized control unit (CCU) receives the temperature information generated by the temperature cell(s) and compares the temperatures against boundary or threshold values to determine if corrective action is needed. If the CCU detects a temperature value exceeding a threshold, it asserts a corrective action signal that is used to initiate corrective action. The corrective action taken will typically reduce the heat produced by the IC in proximity to the TSC that sensed the excessive temperature. In this manner, the IC is made to reduce its own thermal load when temperatures rise above determined levels.

Turning now to the drawings, FIG. 1 is a block diagram of selected thermal control elements within an integrated circuit (IC) 100. IC 100 may be implemented as a general purpose microprocessor, a digital signal processor, an application specific integrated circuit, a programmable array, a memory device, or other circuit capable of generating heat. IC 100 as depicted in FIG. 1 is characterized by dense circuitry and a plurality of macro cells identified by reference numerals 102 through 110. Each macro cell 102-110 represents a major functional block of IC 100. In a general purpose microprocessor implementation, for example, macro cell 102 may represent a memory array, cell 104 may represent a floating point unit, cell 106 may represent a load/store unit, cell 108 may represent an arithmetic logic unit, cell 110 may represent an I/O unit and so forth.

The present invention is not limited to integrated circuits that are comprised of a set of macro cells such as shown in FIG. 1. The invention is, however, particularly amenable to integrated circuits of this type because of the inherent correlation in such devices between functionality and physical location. This correlation enables a precise association between a physical location within the device that may be experiencing an over-temperature condition and the corrective action that might be taken to address the condition. Thus, for example, an over-temperature condition detected near macro cell 102 could be addressed by altering the operation of macro cell 102 to reduce the amount of heat it is producing. The manner of altering the operation to reduce the amount of heat produced is implementation specific, but could include, as examples, decreasing the clocking frequency that drives the macro cell, decreasing the supply voltage provided to the macro cell, or a combination of both.

In the depicted embodiment, each TSC 124 is connected to a temperature cell 122. Each temperature cell is enabled to determine the temperature indicated by the signal received from TSC 124. Temperature cell 122 is further configured to generate a digital signal encoded with the determined temperature. Each temperature cell 122 is likely configured to receive signals from multiple TSCs 124. In the depicted embodiment, for example, each temperature cell 122 receives signals from as many as four TSCs 124. In this configuration, TSCs 124 are local units and temperature cells 122 are regional units. A temperature cell 122 may be located, for example, in each macro cell 102-110 and the multiple TSCs 124 connected to each temperature cell may be dispersed at various locations within the macro cell. In other embodiments, some macro cells may be large enough to justify more than one temperature cell while other macro cells may not have any temperature cells.

The temperatures cells 122 as depicted in FIG. 1 are each connected to a single, centralized thermal control unit 120. Thermal control unit 120, as its name implies, is designed to manage the thermal output of IC 100 by initiating corrective action based upon the temperature indicative information received from the various temperature cells 122. Thermal control unit 120, as described in greater detail below, likely includes circuitry that enables the unit to compare temperature information to predetermined and typically programmable temperature thresholds. Based on the result of such comparison(s), thermal control unit 120 generates at least one signal 130 indicating whether IC 100 needs to take corrective action to reduce its thermal generation. The corrective action signal 130 provides an input to a corrective action unit (not depicted) of IC 100 that is enabled to alter the operating characteristics IC 100 such as by altering the operating characteristics of one or more macro cells 102-110.

Figure 2:
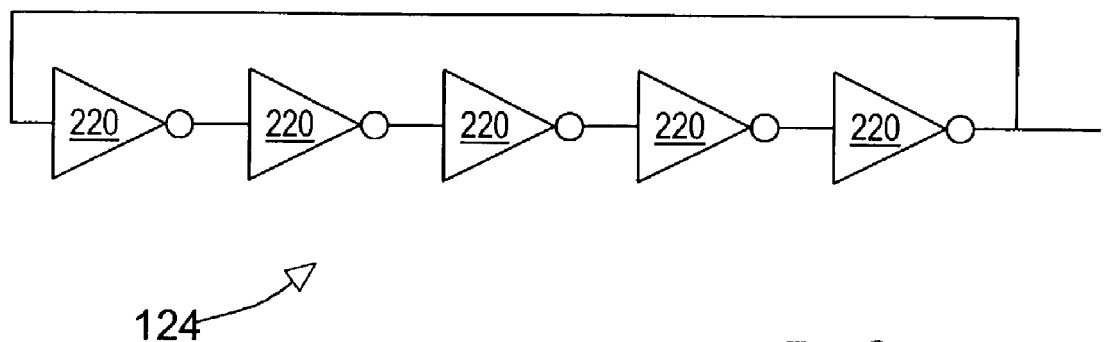
FIG. 2 is a circuit diagram of an embodiment of a temperature sensitive circuit for use in the integrated circuit of FIG. 1.
Figure 3:
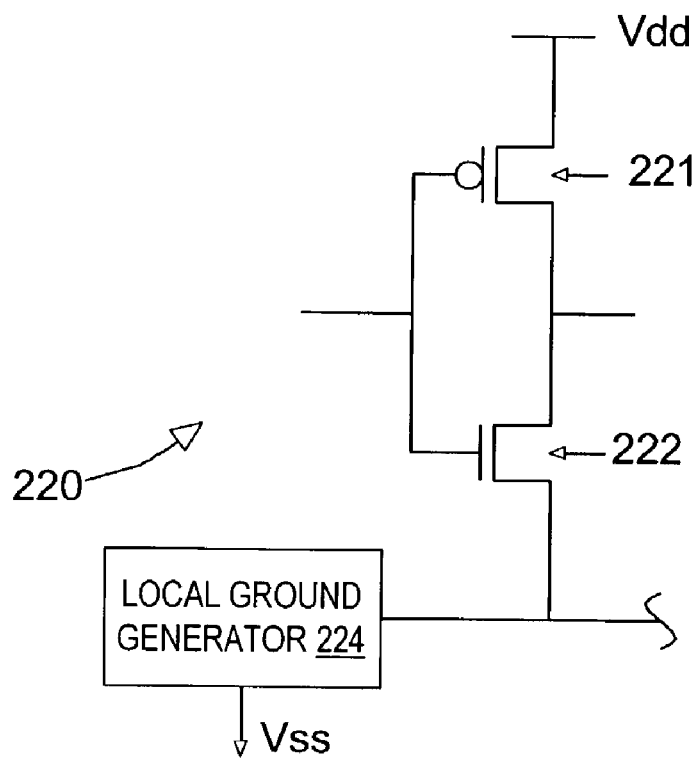
FIG. 3 is a schematic of a CMOS inverter for use in the temperature sensitive circuit of FIG. 2.

Referring now to FIG. 2 and FIG. 3, an embodiment of a TSC 124 suitable for use in IC 100 according to the present invention is depicted. In this embodiment, each TSC 124 is implemented as a digital oscillator having an odd number of CMOS inverters 220 arranged in series. In its simplest form, each CMOS inverter 220 includes just a single p-channel transistor 221 connected between a supply voltage, which may be provided by a regulated voltage and current supply to make inverters 220 sensitive to temperature only, and the output node and a single n-channel transistor 222 connected between the output node and ground. As the substrate temperature rises, the transistors within the substrate slow down in a predictable and consistent manner. Because TSC 124 is integrated into the same semiconductor substrate as the rest of IC 100, TSC 124 provides an inherently accurate indication of the substrate's temperature. In a slightly more elaborate embodiment, a local ground circuit 224 as shown in FIG. 3 provides the rail voltage to the source nodes of the n-channel transistor 222 of each inverter 220. Local ground circuit 224 generates a temperature dependent output voltage. When temperatures rise, the output of circuit 224 (i.e., the local ground node voltage) rises thereby contracting the rail-to-rail voltage applied to the inverters 220 and causing the oscillator to slow.

TSC 124 produces a digital signal that "flips" at a period approximately equal to 5 times the propagation delay of the individual inverters. Because the propagation delay varies as a function of temperature, the frequency of the signal produced by TSC 124 is indicative of the substrate temperature. At higher temperatures, the frequency is lower and vice versa. In the "local ground" embodiment, this temperature dependence is even more pronounced due to the correlation between propagation delay and supply voltage. Thus, in either of the described embodiments, TSC 124 produces a signal having a measurable characteristic that varies with and is indicative of the substrate temperature.

Figure 4:
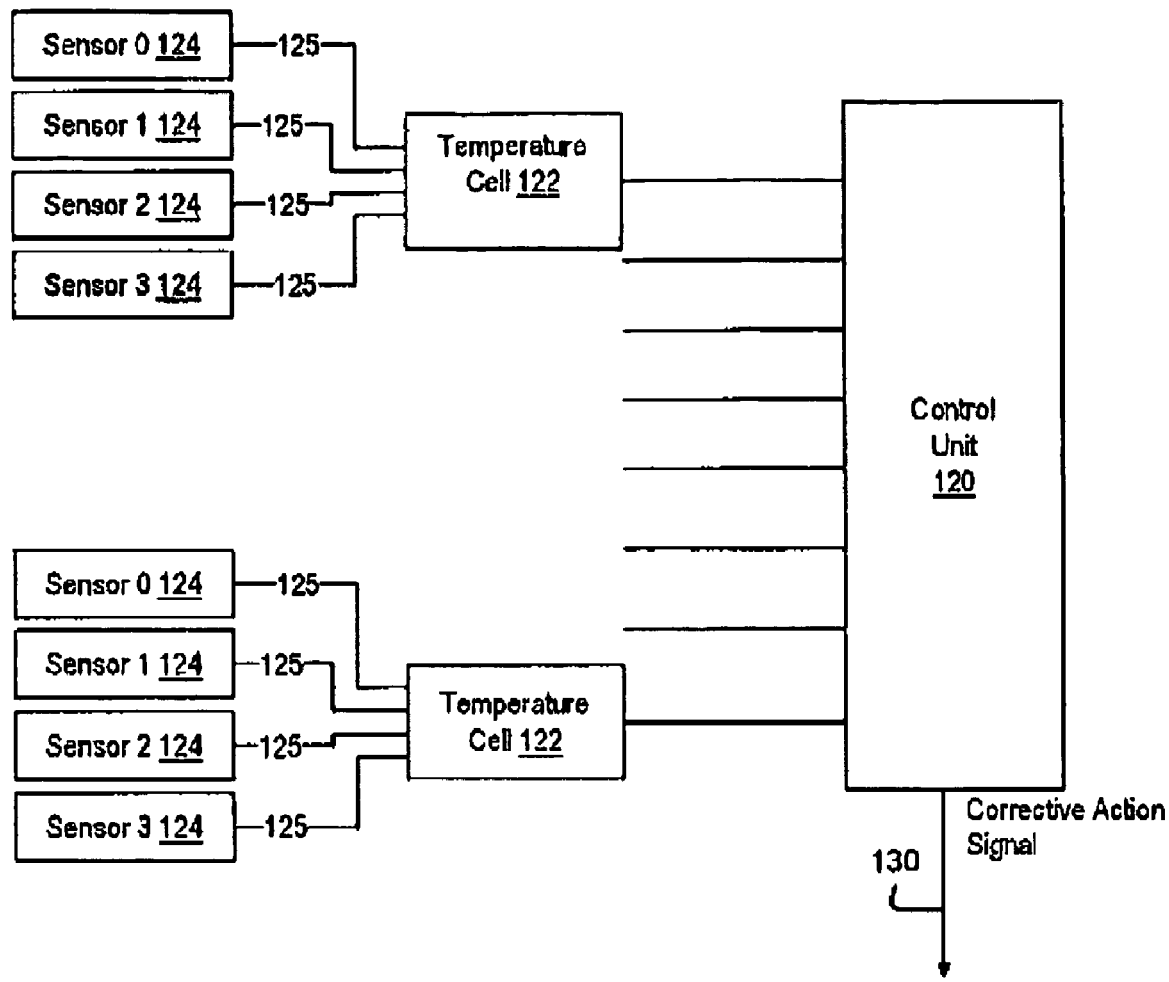
FIG. 4 is a schematic of an embodiment of thermal control circuitry for use in the integrated circuit of FIG. 1.

Turning now to FIG. 4, a schematic illustrating one embodiment of the present invention is presented. This illustration illustrates the relationship among the three major functional thermal awareness components of IC 100. As illustrated in FIG. 4, the thermal awareness components of IC 100 include the TSCs 124, the temperature cells 122, and the thermal control unit 120. As described above, each TSC 124 produces a corresponding oscillating signal (indicated by reference numeral 125) that indicates the substrate temperature in proximity to the TSC. Oscillating signals from as many as four TSCs 124 are received by a single temperature cell 122.

Temperature cells 122 receive as many as four oscillating signals 125 from the TSCs 124. Each temperature cell 122 is configured to calculate or otherwise determine a substrate temperature corresponding to each signal 125. Temperature cells 122 are further arranged to generate a temperature information signal 123 that indicates the temperatures corresponding to each TSC 124.

In one embodiment, each temperature information signal 123 produced by a temperature cell 122 represents a serial signal into which the temperature information of the individual TSCs 124 is time sliced. This serial signal embodiment is highly desirable because of benefits achieved by avoiding parallel busses to convey the information. Specifically, it is clear that a parallel bus produced by each temperature cell 122 would require a significant increase in the number of physical wires (also referred to as traces, interconnects, etc) that would have to be routed across the integrated circuit. Because the types of circuits that benefit most from the thermal awareness elements disclosed herein are, by their nature, densely populated integrated circuits, the addition of one or more parallel signal busses traversing the wafer is a generally undesirable proposition. Moreover, in large area devices, temperature information signal 123 may be required to traverse relatively long paths before connecting to temperature control unit 120. Long circuits typically employ multiple latch stages and re-powering devices. This additional circuitry, which would have to be replicated for each bit in the parallel bus, would generate additional heat thereby reducing one of the primary benefits of using thermal awareness circuitry.

Addressing the problems associated with parallel signal busses, the depicted implementation of temperature cells 122 produce a serial signal on a single wire that conveys the temperature information associated with each TSC 124 to which temperature cell 122 is connected. The depicted embodiment of thermal control unit 120 receives as many as eight temperature information signals 123 from their respective temperature cells 122. Thermal control unit 120 is enabled to extract the temperature information contained in signal 123 and to determine based on the temperature information whether corrective action is needed. It will be appreciated that the depicted embodiment represents but one possible implementation of TSCs 124, temperature cells 122, and control unit 120. Although integrated circuit 100 as depicted in FIG. 4 has a single control unit 120 to which a maximum of 8 temperature cells 122 may be connected, other embodiments (not depicted) may include multiple control units and each control unit may be connected to more or fewer temperature cells than as shown in the depicted implementation. Similarly, other embodiments of temperature cell 122 may receive more or fewer TSC signals than as shown in FIG. 4.

Figure 5:
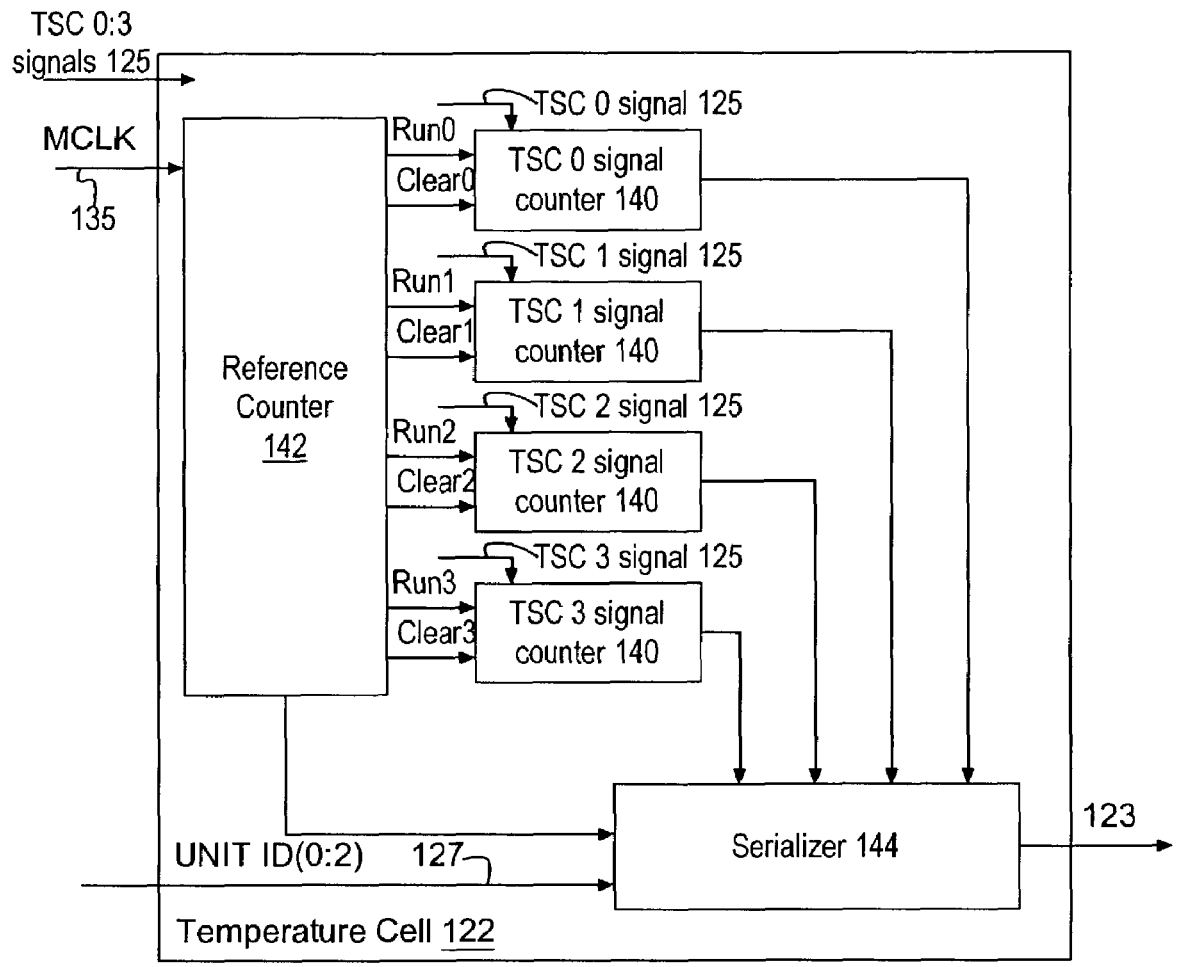
FIG. 5 is a block diagram of an embodiment of a temperature cell for use in the control circuitry of FIG. 4.

Turning now to FIG. 5, additional detail of a possible implementation of temperature cells 122 is illustrated. In this embodiment, temperature cell 122 derives temperature information from TSC signals 125 by comparing the frequency of TSC signals 125 against a known frequency provided by a temperature stable clock signal identified as MCLK signal 135. Thus, temperature cell 122 as depicted receives the TSC signals 125 from up to 4 TSC 124s. The frequency of each TSC signal 125 is compared to the frequency of MCLK 135, which is likely produced by the IC's general clocking circuitry based on an externally supplied oscillating signal produced by a crystal element as is well known. This yields a digital representation of the temperature of the IC in proximity to TSCs 124. In the depicted embodiment, the temperature representations are then serialized to produce a single, serial, temperature information signal 123.

In one embodiment, the frequency comparison described above is achieved using a set of counter circuits 140 for each TSC signal 125 and a reference counter 142. The reference counter 142 is driven by MCLK. MCLK is designed to produce an oscillating signal having a frequency that is largely temperature invariant. Each counter circuit 140 receives a corresponding TSC signal 125 from a corresponding TSC 124. Reference counter 142 as depicted generates Run and Clear signals that are provided to each TSC counter 140. As their names imply, the Run signal initiates the corresponding TSC counter 140 while the Clear signal resets the corresponding counter 140. In an embodiment in which the information corresponding to multiple TSCs 124 is provided to a common wire or bus, the Run and Clear signals of each counter 140 may be asserted at different times depending upon, perhaps, the TSC ID.

In one embodiment, reference counter 142 is a 10-bit counter that "rolls over" once every 1024 ($2^{10}$) cycles of MCLK signal 135 allowing reference counter 142 to count continuously. The run signal "R" provided to each TSC counter 140 is generated by reference counter 142 based on a specifiable count value. This allows the run signal R provided to each TSC counter 140 to be active for the same number of MCLK cycles while also permitting the various TSC counters 140 to start and stop at different times, thereby accommodating the previously described time slicing on the serialized temperature information signal 123. It is desirable to implement the TSC counters 140 with more bits than the reference counter 142. In one embodiment, for example, TSC counters 140 are implemented as 12-bit counters that roll over once every 4096 ($2^{12}$) cycles. The higher bit-width of TSC counters 140 ensures that the TSC counters will not roll over before reference counter 142 rolls, even if the frequency of reference counter 142 is significantly lower than (as little as ¼ of) the TSC signal frequency. This feature is desirable because it is generally desirable to slow the MCLK frequency considerably during "bring up" or testing sequences.

When reference counter 142 reaches the specified count value for a particular TSC counter 140, reference counter 142 stops the corresponding TSC counter by de-asserting (the R signal) thereby capturing the number of TSC signal cycles that have elapsed during a fixed interval. In the depicted embodiment, the count on which reference counter 142 de-asserts the R signal to stop a particular TSC counter 140 is programmable. In one embodiment particularly suitable for the time slicing described previously, reference counter 142 de-asserts the R signal stops at a count of r+1023-32, where r is an 10-bit binary value. When R is deasserted, the captured value of the corresponding TSC counter represents the number of TSC cycles that elapsed during the preceding 992 ($2^{10}$-32) cycles of MCLK signal 135, where 32 cycles are excluded from the period to account for the 32-bit string used to stored the captured count value. Because the MCLK frequency is known and relatively invariant, the frequency of each TSC signal 125 can be determined from the captured information.

In the depicted embodiment, temperature cell 122 includes a serializer that receives that 12-bit counter values from each TSC counter 140 and generates a serial signal that incorporates the counter values. In one embodiment, serializer 144 is configured to produce a 128-bit signal in which each TSC counter 140 is represented by 32 bits. Of these 32 bits, 2 bits are used as start and stop bits, 2 bits are used to convey the TSC ID value, and 12 bits are needed for the TSC count. The remaining 16 bits are "0" cycles according to the serial protocol. In this embodiment, 128 MCLK cycles are need to serialize the digital temperature representation of the four TSCs 124 connected to temperature cell 122. The TSC ID bits are used to identify with which of the four TSCs 124 a particular 12-bit count value is associated.

A 3-bit Unit ID signal 127 is also shown as being provided to temperature cell 122. The Unit ID signal 127 is used to identity one of as many as eight temperature cells 122 connected to a single temperature control unit 120. This information may be incorporated into temperature information signal 123 produced by temperature cell 122 to identify the specific cell that generated the signal.

Figure 6:
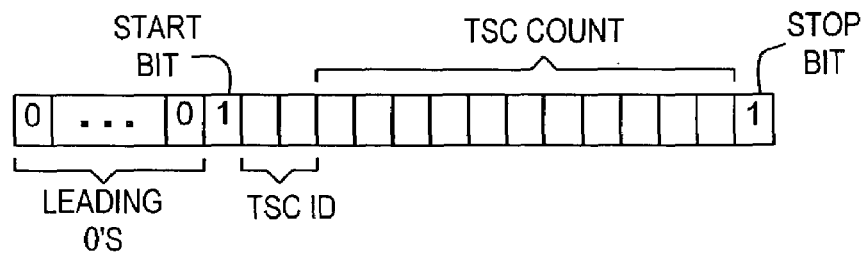
FIG. 6 illustrates an exemplary serial protocol for use with the temperature cell of FIG. 5.

As discussed previously, certain implementations of temperature cell 122 produce a serial temperature information signal 123. An embodiment of a protocol for storing the information generated by temperature cell 122 is illustrated in FIG. 6. In this embodiment, 32 bits are dedicated to convey the 12-bit count information associated with each TSC 124. The 12-bit count information represents the number of TSC signal cycles that transpire during 1024-32 cycles of the reference signal (MCLK 135). Of the 32 bits associated with each TSC, the first 16 bits are padded with 0's. Of the remaining 16 bits, a Start bit and a Stop bit, both having a value of "1", are stored in the 17th bit position and the 32nd bit position respectively. The Start and Stop bits enable a control unit receiving temperature information signal 123 to "align" the serial stream and thereby extract the count information. Of the remaining 14 bits, 2 bits are reserved for a TSC ID value that identifies the TSC 124 to which the count information belongs and the remaining 12 bits are used store the output of the corresponding TSC counter 140. Thus, in this embodiment, 32-bits are required for each TSC 124 and 128 bits (4×32) are required for each temperature cell 122. Since as many as eight temperature cells 122 can be handled by a single control unit 120, 1024 bits (8×128) are sufficient to convey all of the temperature information corresponding to as many as 32 TSCs 124.

Figure 7:
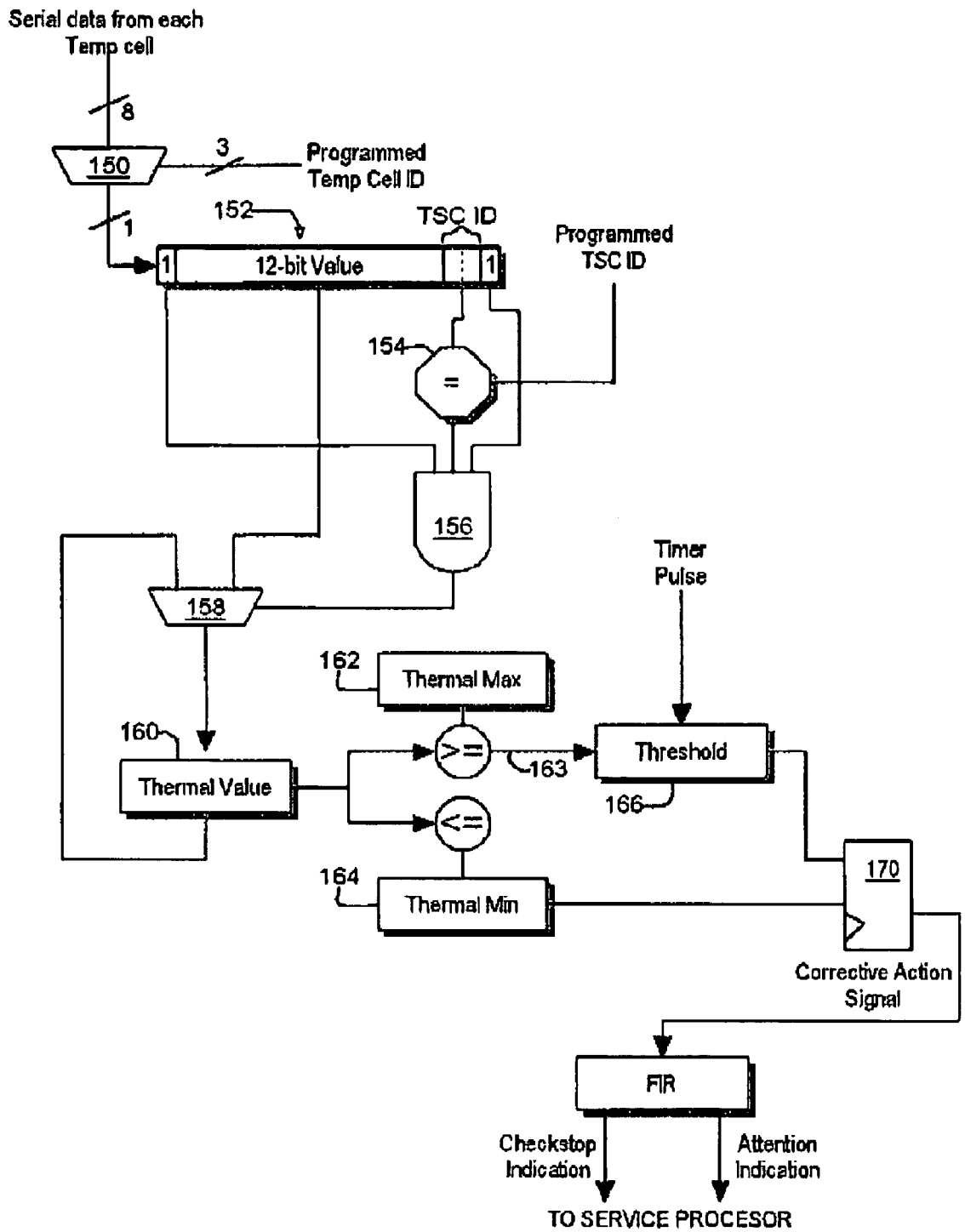
FIG. 7 is a block diagram of a centralized control unit in the thermal control circuit of FIG. 4.

Turning now to FIG. 7, selected elements of an embodiment of centralized temperature control unit 120 are depicted. Generally, control unit 120 receives the information generated by temperature cell 122, extracts or infers a temperature associated with the information, and compares the extracted or inferred temperature against an upper limit or threshold to determine if an over-temperature condition exists. Based on this comparison, the control unit may assert a signal 130 to initiate some form of corrective action. The control unit may include a mechanism to prevent transient temperature surges or spikes from initiating corrective action. The unit may further include a mechanism to maintain the asserted corrective action signal 130 until the temperature drops to a lower temperature threshold thereby creating a hysteresis effect.

In the embodiment depicted in FIG. 7, control unit 120 receives as many as eight temperature information signals 123 from corresponding temperature cells 122. As described previously, each signal 123 may be a serial signal containing temperature information for multiple TSCs 124. A multiplexer 150 gated by a 3-bit temperature cell ID selects one of the eight temperature information signals 123 and forwards the selected signal to 16 bit shift register 152. The serial protocol described with respect to FIG. 6 assures that the AND gate 156 will be activated only when the Start bit of temperature information signal 123 and the Stop bit occupy the first and last bit positions respectively of register 152. At all other times, due to the leading 0's employed by the protocol, one or both of these bit positions in register 152 will be "0" and AND gate 156 will be prevented from forwarding an asserted select signal to multiplexer 158.

When the Start and Stop bits occupy the first and last bits respectively of register 152 and a comparator 154 asserts a signal indicating that the TSC ID information within temperature information signal 123 matches a programmed ID value, AND gate 156 asserts its output and the 12-bit count value in register 152 is selected (via multiplexer 158) to be gated into a thermal value register 160. During all other cycles (when the Start and Stop bits are not aligned or when the TSC IDs do not match the programmed ID), multiplexer 158 selects the thermal value register itself thereby maintaining the last-gated 12-bit count until a new count is received. The thermal value in register 160 is compared against a preferably programmable thermal max value 162 and a lower (thermal min) value 164.

If the thermal value in register 160 exceeds the thermal max value 162, a comparator output signal 163 is asserted. In the depicted embodiment, temperature spikes and/or transients are ignored by routing comparator output signal 163 to a thresholding circuit 166. Circuit 166 will assert its output only if the comparator output signal 163 remains asserted for a specified duration. The duration may be specified in terms of MCLK cycles or in some other manner.

In any event, if the comparator output signal 163 remains asserted long enough, threshold circuit 166 asserts its output thereby setting the flip flop 170 which asserts the corrective action signal 130. The flip flop architecture depicted results in a corrective action 130 that remains asserted until a subsequent event resets flip flop 170. In the depicted embodiment, the resetting event is a positive comparison between the output of thermal value register 160 and a thermal minimum 164. The thermal minimum 164 is generally set some relatively small percentage below the thermal maximum threshold. In this configuration, the corrective action signal remains asserted until the temperature cools down to a value that this less than or equal to thermal minimum 164.

Thermal control unit 120 may include eight copies of the comparative circuitry depicted in FIG. 7, one for each corresponding temperature cell 122. In this embodiment, each of the eight copies selects a different temperature cell ID. In this manner, as many as 32 TSCs 124 can be monitored by a single temperature control unit.

It will be apparent to those skilled in the art having the benefit of this disclosure that the present invention contemplates a thermally aware integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An integrated circuit, comprising:
    a temperature sensing circuit (TSC) for producing a signal having a temperature varying characteristic wherein the characteristic is indicative of the temperature of a substrate in which the sensing circuit is located;
    a temperature cell to receive the TSC signal, measure the temperature varying characteristic of the TSC signal, and produce an output signal indicative thereof; and
    a control circuit configured to receive the temperature cell output signal and to control a corrective action signal based on a comparison between a temperature corresponding to the temperature cell output signal and a predetermined temperature threshold
    further comprising multiple TSCs connected to a temperature cell wherein each TSC provides a corresponding TSC output signal to the temperature cell;
    wherein each TSC output signal is indicative of the temperature associated with the corresponding TSC;
    wherein temperature cell is configured to generate a temperature cell output signal, wherein the temperature cell output signal is a serial signal wherein each of the TSC output signals comprises a respective time slice of the serial signal.

2. The integrated circuit of claim 1, wherein the TSC comprises an odd number of CMOS inverters connected in series.

3. The integrated circuit of claim 1, wherein the TSC signal has a temperature dependent frequency.

4. The integrated circuit of claim 3, wherein the temperature cell is configured to count the number of cycles in the TSC for a known duration.

5. The integrated circuit of claim 4, wherein the known duration represents a specified number of cycles of a temperature invariant clock signal.

6. The integrated circuit of claim 1, wherein a temperature control unit is configured to receive an output signal from each of a set of temperature cells.

7. The integrated circuit of claim 1, wherein a temperature control unit asserts the corrective action signal if the temperature corresponding to the temperature cell output signal exceeds the temperature threshold.

8. The integrated circuit of claim 7, wherein the temperature control unit asserts the corrective action if the temperature corresponding to the temperature cell output signal exceeds the temperature threshold for a specified duration.

9. The integrated circuit of claim 7, wherein, following assertion of the corrective action signal, the temperature control circuit maintains the corrective action asserted until the temperature corresponding to the temperature cell output signal falls below a specified minimum, wherein the minimum is less than the threshold.

10. An integrated circuit, comprising:
 a temperature sensing circuit configured to generate a signal indicative of the integrated circuit's temperature in proximity to the sensing circuit; and
 comparison circuitry configured to assert a corrective action signal responsive to the sensed integrated circuit temperature exceeding a specified threshold;
 wherein the temperature sensing circuit comprises an oscillating circuit producing a signal having a temperature dependent frequency;
 wherein the comparison circuitry includes means for comparing the frequency of the sensing circuit signal to a signal having a temperature stable frequency by counting the number of sensing circuit signal cycles that occur during a specified number of cycles of the temperature stable signal.

11. The integrated circuit of claim 10, further comprising a plurality of sensing circuits and means for serializing temperature information derived from a corresponding plurality of sensing circuit signals.

* * * * *

UNITED STATES PATENT AND TRADEMARK OFFICE
CERTIFICATE OF CORRECTION

PATENT NO.       : 7,657,772 B2                      Page 1 of 1
APPLICATION NO.  : 10/366437
DATED            : February 2, 2010
INVENTOR(S)      : Clabes et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1697 days.

Signed and Sealed this

Thirtieth Day of November, 2010

David J. Kappos
*Director of the United States Patent and Trademark Office*